US005789460A

United States Patent [19]
Harkness et al.

[11] Patent Number: 5,789,460
[45] Date of Patent: Aug. 4, 1998

[54] RADIATION CURABLE COMPOSITIONS

[75] Inventors: Brian Robert Harkness, Cowbridge, United Kingdom; Mamoru Tachikawa, Kanagawa Prefecture, Japan

[73] Assignee: Dow Corning Asia, Ltd., Tokyo, Japan

[21] Appl. No.: 590,847

[22] Filed: Jan. 24, 1996

[30] Foreign Application Priority Data

Feb. 2, 1995 [JP] Japan .................................. 7-016193

[51] Int. Cl.$^6$ ...................................................... C08J 3/28
[52] U.S. Cl. ............................. 522/148; 522/40; 522/59; 522/63; 522/65; 522/99; 430/270.1
[58] Field of Search ...................... 430/270.1; 522/148, 522/99, 65, 40, 59, 63

[56] References Cited

U.S. PATENT DOCUMENTS 5,348,839  9/1994  Haluska et al. ........................ 430/270

FOREIGN PATENT DOCUMENTS

| 91131 | 10/1983 | European Pat. Off. . |
| 555749 | 8/1993 | European Pat. Off. . |
| 80879 | 3/1994 | Japan . |
| 148887 | 5/1994 | Japan . |

OTHER PUBLICATIONS

Abstract translation of Japanese Patent 06–148887 May 1994.
Chemistry and Technology of Silicones, 2nd Edition, p. 175, Walter Noll, Academic Press, Inc. (London) Ltd., 1968.
Database WPI, Week 9426, Derwent Publications Ltd., London, GB, AN 94-211957, May 27, 1994.
Chemistry and Technology of Silicones, 2nd Edition, p. 90, Walter Noll, Academic Press, Inc. (London) Ltd., 1968.
Organosilicon Compounds, p. 200, C. Eaborn, Butterworths Scientific Publications (London) 1960.
Chemistry and Technology of Silicones, p. 205, p. 397.
Encyclopedia of Polymer Science and Engineering, vol. 9, pp. 97–138.
Lithographic Resists, Wiley–Inter Science (New York), 1985.
Jpn. J. Appl. Phys., vol. 32 (1993), pp. 6052–6058.
M.R. Winkle, K. A. Graziano, J. Photopolym. Sci. Technol., 1990, 3, 419–422.
J.F. Cameron & J.M. Frecht, J. Am. Chem. Soc., 1991, 113, 4303–4313.
J.M. Frechet and J.F. Cameron, Pdym. Mater. Sci. Eng., 64, 55 (1991).

*Primary Examiner*—Marion E. McCamish
*Assistant Examiner*—Cheryl Juska
*Attorney, Agent, or Firm*—Sharon K. Severance; Roger E. Gobrogge

[57] ABSTRACT

Curable compositions comprising a substance that produces a base when exposed to radiation and a polymer molecule that contains silicon-hydrogen bonds which react with hydroxyl groups under the action of the base to form silicon-oxygen bonds (Si—O) and hydrogen molecules. These compositions cure when exposed to radiation. A pattern can be formed by placing a mask between a coating of the composition and the radiation source during this exposure episode and thereafter dissolving the uncured composition. The compositions have little weight loss during their cure, they can be cured by low intensity radiation, and they yield heat-resistant cured products.

11 Claims, No Drawings

RADIATION CURABLE COMPOSITIONS

BACKGROUND OF THE INVENTION

This invention relates to radiation-curable, silicon-containing resin compositions that can be used to fabricate films. These films can be used, for example, as dielectric films in semiconductor devices. The invention also relates to methods for curing these compositions and for using these compositions for forming patterns.

It is well known in silicon chemistry and the silicone industry that the hydroxyl group (e.g., water, alcohol, silanol, etc.) will react with a hydrogen atom bonded directly to silicon to produce a hydrogen molecule and the silicon-oxygen bond, i.e., Si—O (refer to *Chemistry and Technology of Silicones*, 2nd Edition, p. 90, Walter Noll, Academic Press, Inc. (London) Ltd., 1968; *Organosilicon Compounds*, p. 200, C. Eaborn, Butterworths Scientific Publications (London), 1960). Although the uncatalyzed reaction will run at elevated temperatures, it is widely known that this reaction will run more readily in the presence of a transition metal catalyst such as platinum, palladium, etc., or in the presence of a basic catalyst such as an alkali metal hydroxide, amine, etc., or in the presence of a Lewis acid catalyst such as a tin compound, etc. Moreover, the reaction between Si—H and SiOH has been proposed as a room-temperature curing mechanism for silicones (*Chemistry and Technology of Silicones*, p. 205, p. 397).

Radiation-mediated resin curing reactions are also known in the art. Refer, for example, to Tsugio Yamaoka and Hiroshi Morita, *Photosensitive Resins*, published by Kyoritsu Shuppan, 1988; *Encyclopedia of Polymer Science and Engineering*, Volume 9, pp. 97–138; *Lithographic Resists*, Wiley-Interscience (New York), 1985; and Saburo Nonogaki, *Microprocessing and Resists*, published by Kyoritsu Shuppan, 1987, and so forth.

Radiation-mediated resin curing can proceed, for example, through a crosslinking reaction or through a polymerization reaction. The crosslinking reaction is exemplified by the photodimerization of cinnamic acid compounds; the reaction between the mercapto group and an olefin; and reactions based on photosensitive groups such as the diazo group or azide group.

The polymerization reaction approach is exemplified by the combination of a functional group such as the acryloyl or methacryloyl group with a polymerization initiator that generates radicals upon irradiation and cationic polymerization of the epoxy group, lactone, active vinyl group, etc., based on the radiation-induced generation of a cationic polymerization initiator.

Curing methods are also available in which the crosslinking or polymerization reaction is induced through the catalytic activity of an acid which is generated by a substance upon exposure to radiation (hereinafter abbreviated as an acid generator). The acid generators used in these methods include aryldiazonium salts, diaryliodonium salts, triarylsulfonium salts, triarylselenonium salts, dialkylphenacylsulfonium salts, dialkyl-4-hydroxyphenylsulfonium salts, sulfonate esters, iron-arene compounds, silanol-aluminum complexes, and so forth.

Specific examples of curing using acid generators include the curing of epoxy resins through the radiation-induced generation of a Lewis acid such as boron trifluoride (S. I. Schlesinger, *Polym. Eng. Sci.*, 14, 513 (1974); G. Smets, A. Aerts, and J. Van Erum, *Polym. J.*, 12, 539 (1980); the fabrication of silicic acid glass thin films from the combination of a special siloxane and an acid generator (Japanese Patent Application Laid Open [Kokai or Unexamined] Number Hei 6-80879 [80,879/1994]; *Jpn. J. Appl. Phys.*, Volume 32(1993), pp. 6052–6058); and photocuring technologies for epoxy resins that use aluminum compounds and ortho-nitrobenzoyloxy silicon compounds (S. Hayase, T. Ito, S. Suzuki, and M. Wada, *J. Polym. Chem. Ed.*, 20, 3155 (1982); ibid, 19, 2185 (1981); S. Hayase, Y. Onishi, S. Suzuki, and M. Wada, *Macromolecules*, 18, 1799 (1985); and Japanese Patent Application Laid Open [Kokai or Unexamined] Number Sho 58-174418 [174,418/1983]).

Curing reactions that use a substance which evolves base upon exposure to radiation (hereinafter abbreviated as a base generator) are also being investigated. The base generators used in this technology include organic and inorganic nitrogenous compounds that, upon irradiation, produce organic amine, ammonia, or quaternary ammonium hydroxide. Examples of such compounds include ortho-nitrobenzyl benzylcarbamate compounds (M. R. Winkle and K. A. Graziano, *J. Photopolym. Sci. Technol.*, 1990, 3, 419; J. F. Cameron and J. M. Frechet, *J. Am. Chem. Soc.*, 1991, 113, 4303; J. M. Frechet and J. F. Cameron, *Polym. Mater. Sci. Eng.*, 64, 55(1991)); metal-ammine complexes (for example, S. K. Weit, C. Kutal, and R. D. Allen, *Chem. Mater.*, 4, 453–457 (1992)); and 4- (ortho-nitrophenyl) dihydropyridines (DE Patentschrift 1,923,990).

Curing using base generators is specifically exemplified by the radiogenerated base-catalyzed cure of compositions comprising phenolic resin plus epoxy crosslinker plus melamine curing agent (EP 0555749 A1; J. M. Frechet and J. F. Cameron, *Polym. Mater. Sci. Eng.*, 64, 55 (1991); C. Kutal and C. G. Wilson, *J. Electrochem. Soc.*, 134, 2280–2285 (1987)) and the radiogenerated base-catalyzed cure of poly(silsesquioxane) alone or in combination with tetraphenoxysilane (Japanese Patent Application Laid Open [Kokai or Unexamined] Number Hei 6-148887 [148,887/1994]).

The cured regions produced by crosslinking in these methods are generally much less solvent-soluble than the uncured regions. This property can be utilized for imaging and patterning applications.

The above curing systems have several deficiencies. For instance, curing systems that use the photodimerization of cinnamic acid compounds, curing systems in which the photosensitive group is the diazo or azide group, curing systems that utilize the addition of mercaptan across olefin, and curing systems based on the polymerization of such functional groups as the acryloyl group, methacryloyl group are generally not thermally stable. As such, these types of systems do not yield a cured product that can withstand use or processing at high temperatures.

Likewise, curing reactions using the dimerization of cinnamic acid compounds and the reactions mediated by radicals generated from the diazo or azide group are equivalent reactions with regard to the photoreaction, i.e., no amplification effect is present. These systems are, therefore, not suited for curing with low-intensity (i.e., low numbers of photons) radiation.

Similarly, curing systems based on the addition of mercaptan across olefin result in an undesirable odor and corrosivity. Additionally, curing systems based on the radical polymerization of functional groups such as acryloyl, methacryloyl, etc. can be inhibited by air (oxygen).

Curing systems that utilize photogenerated acid offer a number of advantages such as (1) an amplification effect even with low-intensity radiation because the generated acid functions as a catalyst of the crosslinking reaction, and (2)

the cure systems are not inhibited by oxygen. However, this curing system also has drawbacks such as (1) the tendency of the acid to corrode base materials and (2) problems with the electrical properties of the cured material due to the presence of ionic residues.

Curing systems that utilize photogenerated acid are also limited to materials capable of acid-catalyzed polymerization, i.e., generally to the epoxy group, acrylic group, and the like. One exception, however, is the report of the fabrication of silicic acid glass thin films through the combination of a special siloxane and an acid generator (Japanese Patent Application Laid Open [Kokai or Unexamined] Number Hei 6-80879; *Jpn. J. Appl. Phys.*, Volume 32(1993), pp. 6052–6058). The method described in this reference, however, requires an extremely specialized polysiloxane. Moreover, the reaction results in a large weight loss causing pinholing, cracking, etc. which are fatal for application such as protective coatings, dielectric coatings, or planarizing coatings.

Base generator curing technology offers the same advantages as acid generator curing technology, i.e., (1) it provides an amplification effect for the crosslinking reaction, even with low-intensity radiation, because the generated base again functions as a catalyst of the crosslinking reaction, (2) oxygen does not inhibit the cure and (3) substrate corrosion is a less significant problem than with acid generator technology.

The present invention is directed to solving the problems described above. It introduces (a) radiation-curable compositions that undergo very little cure-associated weight loss, can be cured by low-intensity radiation, and provide a heat-resistant cured product; (b) methods for curing the aforesaid radiation-curable compositions; and (c) a method of forming patterns that utilizes the aforesaid compositions and curing methods.

BRIEF DESCRIPTION OF THE INVENTION

The present invention relates to a curable composition. The composition comprises a substance that produces a base when exposed to radiation. This substance is selected from the group consisting of benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, and 4-(ortho-nitrophenyl) dihydropyridines and is present at from 0.01 to 50 weight % based on the total weight of the composition. The composition also comprises a polymer molecule that contains silicon-hydrogen bonds which react with hydroxyl groups under the action of the base to form silicon-oxygen bonds and hydrogen molecules. Each polymer molecule contains on average at least 2 silicon atoms that have 1 silicon-hydrogen bond and at least 2 silicon-oxygen bonds. This composition can be cured by radiation and can be used to form patterned coatings.

DETAILED DESCRIPTION OF THE INVENTION

Compositions according to the present invention comprise substances that produces base when radiated ("base generating substance") and polymers that contains silicon-hydrogen bonds which are capable of reacting with hydroxyl groups (OH) under the action of the base to form silicon-oxygen bonds (Si—O) and hydrogen molecules ($H_2$). This technology rapidly forms highly heat-resistant silicone films or coatings on substrates without excessively high substrate temperatures. In addition, these compositions have been designed to cure only in the areas exposed to radiation. As such, patterns can be formed on the substrate by using a photomask.

The first embodiment of the present invention is a curable composition comprising
 (i) a base-generating substance that produces base under the action of radiation (base generator) and
 (ii) a polymer molecule that contains silicon-hydrogen bonds (Si—H) capable of forming the silicon-oxygen bond (Si—O) and a hydrogen molecule ($H_2$) by reacting with a hydroxyl group (OH) under the action of the aforesaid base.

When this composition is exposed to radiation, a basic compound is generated and the composition will cure.

If the Si—O bond-forming reaction is not fast enough, the reaction can be heated at a suitable temperature in order to accelerate the base-catalyzed crosslinking reaction. Likewise, if the reaction is run in an atmosphere having a relative humidity of at least 10%, atmospheric moisture is introduced into the composition and participates in the crosslinking reaction.

The base generator used herein comprises at least 1 material selected from the group consisting of benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, and 4-(ortho-nitrophenyl)dihydropyridines.

Since the radiogenerated base in the composition has a catalytic effect on the curing reaction, the base generator should be added in a catalytic quantity based on the number of silicon-hydrogen bonds in the composition. The curing reaction will be slow when too little base generator is added. The addition of too much base generator results in problems such as weak physical properties by the composition prior to its cure and impairment of the physical properties of the cured composition. Generally, the base generator is present at from 0.01 to 50 weight % of the total weight of the curable composition. Preferably, the base generator is used at from 0.1 to 25 weight % based on the total weight of the curable composition.

The base generators are specifically exemplified by follows:

(1) benzyl carbamates of the formula $ArCHR^2OC(=O)NR^3R^4$, wherein $R^2$ can be the hydrogen atom (H), alkyl, or aryl, $R^3$ can be H, aryl, or alkyl, $R^4$ is aryl or alkyl, and Ar is aryl;

(2) benzoin carbamates of the formula $ArC(=O)CHArOC(=O)NR^5R^6$, wherein $R^5$ is H or alkyl, $R^6$ is aryl or alkyl, and Ar is aryl;

(3) O-carbamoylhydroxyamines of the formula $R^7R^8NOC(=O)NR^9R^{10}$, wherein $R^9$ is H or alkyl, $R^{10}$ is aryl or alkyl, and $R^7$ and $R^8$ can in each case be H, alkyl, aryl, or acyl;

(4) O-carbamoyloximes of the formula $R^{11}R^{12}C=NOC(=O)NR^{13}R^{14}$, wherein $R^{13}$ is H or alkyl, $R^{14}$ is aryl or alkyl, and $R^{11}$ and $R^{12}$ can in each case be H, alkyl, or aryl;

(5) aromatic sulfonamides of the formula $ArS(=O)_2NR^{15}R^{16}$, wherein $R^{15}$ is H or alkyl, $R^{16}$ is aryl or alkyl, and Ar is aryl;

(6) alpha-lactams of the formula $R^{17}CHC(=O)NR^{18}$, wherein $R^{18}$ is aryl or alkyl and $R^{17}$ is aryl or alkyl;

(7) N-(2-allylethenyl)amides of the formula $R^{19}C(=O)NR^{20}CH=CHAr$, wherein $R^{19}$ is aryl or alkyl, $R^{20}$ is alkyl, and Ar is aryl;

(8) arylazide compounds of the formula $ArN_3$, wherein Ar is aryl or substituted aryl;

(9) N-arylformamides of the formula ArNHC(=O)H, wherein Ar is aryl or substituted aryl; and

(10) 4-(ortho-nitrophenyl)dihydropyridines in which an alkyl substituent is bonded at position 1 of the dihydropyridine.

Among the base generators listed above, the following are preferred because of ease of preparation, handling and photolysis:

(A) benzyl carbamates with the structure BzCH$_2$OC(=O)NR$^3$R$^4$ in which the nitro group is substituted at the 2 position or at the 2 and 6 positions of the benzyl (Bz) group, the methoxy group is optionally substituted at position 4 or 5 of the benzyl group, R$^3$ is H, C$_1$ to C$_{10}$ alkyl, aralkyl, or aryl, and R$^4$ is C$_1$ to C$_{10}$ alkyl, aralkyl, or aryl;

(B) benzoin carbamates ArC(=O)CHArOC(=O)NR$^5$R$^6$ in which Ar is phenyl, R$^5$ is the hydrogen atom and R$^6$ is C$_5$ to C$_{10}$ alkyl;

(C) O-carbamoylhydroxyamines R$^7$R$^8$NOC(=O)NR$^9$R$^{10}$ in which R$^7$ and R$^8$ are bonded with each other to give the phthaloyl group, R$^9$ is the hydrogen atom, and R$^{10}$ is C$_5$ to C$_{10}$ alkyl; and (D) 4-(ortho-nitrophenyl)dihydropyridines in which the methyl or ethyl group is bonded at position 1 of the dihydropyridine and the methoxycarbonyl group is bonded at positions 3 and 5 of the dihydropyridine. These base generators should be used at 0.1 to 25 weight % of the composition.

The silicon-hydrogen bond (Si—H containing — hereinafter SiH-functional) polymer molecule in the curable composition of the invention is selected from silicone polymer molecules and silicone-modified organic resins wherein the organic resins are typified by alkyd resins, polyester resins, acrylic resins, epoxy resins, phenolic resins, polyimide resins, and so forth.

General methods for the preparation of silicone-modified organic resins are known (refer, for example, to *Silicone Handbook*, edited by Kunio Itoh, Nikkan Kogyo Shinbunsha (1990), pages 494 to 499). Examples include silicone-modified alkyd resins which can be prepared by an alcohol-eliminating reaction between SiH-functional organoalkoxy-polysiloxane and an alkyd and silicone-modified polyester resins which can be prepared by reacting the alcoholic hydroxyl groups of a polyester with the silanol or alkoxy in SiH-functional silicone. The silicone-modified polyimide resins can be prepared, for example, by the reaction of cyclic methylhydrogensiloxane and alkenyl-functional polyimide (for example, Japanese Patent Application Laid Open [Kokai or Unexamined] Number Hei 6-73074 [73,074/1994]).

The SiH-functional polymer molecule is preferably a silicone polymer molecule with the skeletal structure given by general formula (1):

(1) (R$_3$SiO$_{1/2}$)$_a$(R$_2$SiO$_{2/2}$)$_b$(RSiO$_{3/2}$)$_c$(SiO$_{4/2}$)$_d$

Each R in this formula is a monovalent radical independently selected from the hydrogen atom and C$_1$ to C$_8$ hydrocarbon groups which may contain at least 1 atom selected from oxygen, nitrogen, chlorine, silicon, and fluorine. Furthermore, in each polymer molecule R is the hydrogen atom on average for at least 2 of the R$_2$SiO$_{2/2}$ and RSiO$_{3/2}$ units considered collectively (when there are two R, at least 1 may be the hydrogen atom), while the divalent oxygen atom bonded to silicon in R$_3$SiO$_{1/2}$ is bonded to another silicon atom to form a siloxane bond. With regard to the divalent oxygen atoms bonded to silicon in R$_2$SiO$_{2/2}$, RSiO$_{3/2}$, and SiO$_{4/2}$, in each case at least 1 of said divalent oxygen atoms is bonded to another silicon to form a siloxane bond, while the remaining oxygen may be bonded to another silicon to form a siloxane bond, or may be bonded to hydrogen to form a silanol group, or may be bonded to C$_1$ to C$_6$ alkyl, C$_1$ to C$_6$ alkenyl, or C$_6$ to C$_8$ aryl to form, respectively, an alkoxy group, alkenoxy group, or aryloxy group.

The average degree of polymerization of the silicone polymer molecule of formula (1), i.e., a+b+c+d, is at least 5, and the average proportions of the monomeric units relative to the polymer molecule fall within the following ranges:

$0.7 > a/(a+b+c+d) \geq 0$ $1 \geq b/(a+b+c+d) \geq 0$ $1 \geq c/(a+b+c+d) \geq 0$ $0.65 \geq d/(a+b+c+d) \geq 0.$ The R$_3$Si moiety of the R$_3$SiO$_{1/2}$ is specifically exemplified by dimethylsilyl, trimethylsilyl, phenyldimethylsilyl, diphenylmethysilyl, vinyldimethysilyl, phenylmethylsilyl, vinyldimethylsilyl, (1,1,1-trifluoropropyl)dimethylsilyl, (trimethylsilyl)dimethylsilyl, and triphenylsilyl.

The R$_2$Si moiety of R$_2$SiO$_{2/2}$ is exemplified by dimethylsilylene, methylhydrogensilylene, methylphenylsilylene, methylvinylsilylene, methyl(1,1,1-trifluoropropyl)silylene, methylethylsilylene, diphenylsilylene, phenylhydrogensilylene, and phenylvinylsilylene.

The R in RSiO$_{3/2}$ is exemplified by hydrogen, methyl, ethyl, propyl, butyl, hexyl, octyl, trifluoropropyl, trimethylsilylmethyl, phenyl, para-tolyl, meta-tolyl, 4-vinylphenyl, and so forth.

The following are examples of the aforesaid SiH-functional polymer molecules in which HSiO$_{3/2}$ provides the Si—H bond:

Silicone polymers whose main structural component is the R$_2$SiO unit, as typified by dimethoxysilyl-endblocked polydimethylsiloxanes, diethoxysilyl-endblocked polydimethylsiloxanes, bis(trimethylsiloxy)silyl-endblocked polydimethylsiloxanes, dimethoxysilyl-endblocked polyphenylmethylsiloxanes, bis(trimethylsiloxy)silyl-endblocked polyphenylmethylsiloxanes, dimethoxysilyl-endblocked diphenylsiloxane oligomers, diethoxysilyl-endblocked polydimethylsiloxanes in which the methoxyhydrogensiloxane group (CH$_3$O(H)SiO) is inserted in the polymer main chain, and bis(trimethylsiloxy)silyl-endblocked polydimethylsiloxanes in which the trimethylsiloxyhydrogensiloxane group ((CH$_3$)$_3$SiO(H)SiO) is inserted in the polymer main chain;

D-T resins, as typified by resins prepared by cohydrolysis from dimethyldichlorosilane, methyltrichlorosilane, and trichlorosilane as the main precursors, resins prepared by cohydrolysis from dimethyldichlorosilane, phenyltrichlorosilane, and trichlorosilane as the main precursors, resins prepared by cohydrolysis from diphenyldichlorosilane, methyltrichlorosilane, and trichlorosilane as the main precursors, resins prepared by cohydrolysis from diphenyldichlorosilane, phenyltrichlorosilane, and trichlorosilane as the main precursors, resins prepared by condensation and hydrolysis from diphenylsilanediol, methyltrichlorosilane, and trichlorosilane as the main precursors, resins prepared by condensation and hydrolysis from diphenylsilanediol, phenyltrichlorosilane, and trichlorosilane as the main precursors, resins prepared by condensation and hydrolysis from diphenylsilanediol and trichlorosilane as the main precursors, and resins prepared by condensation from diphenylsilanediol, methyltrimethoxysilane, and trimethoxysilane as the main precursors;

Polysilsesquioxane resins, as typified by resins prepared by cohydrolysis from phenyltrichlorosilane and trichlorosilane as the main precursors, resins prepared by cohydrolysis from methyltrichlorosilane and trichlorosilane as the main precursors, resins prepared by cohydrolysis from n-hexyltrichlorosilane and trichlorosilane as the main precursors, resins prepared by cohydrolysis from 4-vinylphenyltrichlorosilane and trichlorosilane as the main precursors, resins prepared by cohydrolysis from trichlorosilane as the main precursor, resins prepared by cohydrolysis from trimethoxysilane as the main precursor, and resins prepared by cohydrolysis from triethoxysilane as the main precursor;

M-Q type resins that contain the $HSiO_{3/2}$ unit, as typified by resins prepared by cohydrolysis from trimethylchlorosilane, trichlorosilane, and silicon tetrachloride as the main precursors, resins prepared by cohydrolysis from phenyldimethylchlorosilane, trichlorosilane, and silicon tetrachloride as the main precursors, and resins prepared by cohydrolysis from vinyldimethylchlorosilane, trichlorosilane and silicon tetrachloride as the main precursors.

The following are examples of the aforesaid SiH-functional polymer molecules in which $HRSiO_{2/2}$ furnishes the Si—H bond (R is a monovalent radical selected from the hydrogen atom and $C_1$ to $C_8$ hydrocarbon groups which may contain at least 1 atom selected from oxygen, nitrogen, chlorine, silicon, and fluorine):

Silicone polymers whose main structural component is the $R_2SiO$ unit, as typified by methoxymethylsilyl-endblocked polydimethylsiloxanes, ethoxymethylsilyl-endblocked polydimethylsiloxanes, (trimethylsiloxy)methylsilyl-endblocked polydimethylsiloxanes, methoxy(methyl)silyl-endblocked polyphenylmethylsiloxanes, (trimethylsiloxy)phenylsilyl-endblocked polyphenylmethylsiloxanes, methoxy(phenyl)silyl-endblocked diphenylsiloxane oligomers, ethoxysilyl-endblocked polydimethylsiloxanes in which the methylhydrogensiloxane group ($CH_3(H)SiO$) is inserted in the polymer main chain, and (trimethylsiloxy)phenylsilyl-endblocked polydimethylsiloxanes in which the phenylhydrogensiloxane group (Ph(H)SiO) is inserted in the polymer main chain;

D-T resins, as typified by resins prepared by cohydrolysis from dimethyldichlorosilane, methyltrichlorosilane, and dichlorosilane as the main precursors, resins prepared by cohydrolysis from dimethyldichlorosilane, phenyltrichlorosilane, and methyldichlorosilane as the main precursors, resins prepared by cohydrolysis from diphenyldichlorosilane, methyltrichlorosilane, and methyldichlorosilane as the main precursors, resins prepared by cohydrolysis from diphenyldichlorosilane, phenyltrichlorosilane, and phenyldichlorosilane as the main precursors, resins prepared by condensation and hydrolysis from diphenylsilanediol, methyltrichlorosilane, and methyldichlorosilane as the main precursors, resins prepared by condensation and hydrolysis from diphenylsilanediol, phenyltrichlorosilane, and phenyldichlorosilane as the main precursors, resins prepared by condensation and hydrolysis from diphenylsilanediol and methyldichlorosilane as the main precursors, and resins prepared by condensation from diphenylsilanediol, methyltrimethoxysilane, and methyldimethoxysilane as the main precursors; and the linear and cyclic siloxanes afforded by the (co)hydrolysis of one or several SiH-functional dichlorosilanes, for example, methyldichlorosilane, phenyldichlorosilane, vinyldichlorosilane, and so forth.

The second embodiment of the present invention is a curable composition comprising a curable composition according to the first embodiment that additionally contains an OH-functional crosslinker (iii).

The OH-functional crosslinker crosslinks the silicone polymer molecules by reacting with the Si—H bond to form a siloxane bond (Si—O—Si) or Si—O—C bond. This OH-functional crosslinker is selected from the group consisting of water, silane compounds that have at least 2 silanol groups (SiOH) per molecule, silicone polymer molecules that contain on average at least 2 silanol groups (SiOH) in each polymer molecule, and organic compounds that contain on average at least 2 hydroxyl groups per molecule.

The silane compounds containing at least 2 silanol groups per molecule are exemplified by di(aryl)silanediols such as diphenylsilanediol, di(meta-tolyl)silanediol, di(para-tolyl)silanediol, and so forth, and by bulky alkyl-containing di(alkyl)silanediols, as typified by di(cyclohexyl)silanediol.

Silicone polymer molecules that contain on average at least 2 silanol groups (SiOH) per polymer molecule are exemplified by the following: silanol-endblocked oligomers and polymers of dimethylsiloxane; silanol-endblocked oligomers of diphenylsiloxane; silanol-functional poly(silsesquioxane)s, as typified by silanol-terminated poly(phenylsilsesquioxane) and silanol-terminated poly(methylsilsesquioxane); silanol-functional D-T resins, as typified by silanol-containing dimethylsiloxane-methylsilsesquioxane copolymer resins, silanol-functional diphenylsiloxane-methylsilsesquioxane copolymer resins, silanol-functional dimethylsiloxane-phenylsilsesquioxane copolymer resins, and silanol-functional diphenylsiloxane-phenylsilsesquioxane copolymer resins; and the aforementioned silanol-functional poly(silsesquioxane)s and D-T resins containing the dimethylsilyl group, trimethylsilyl group, vinyldimethylsilyl group, or phenyldimethylsilyl group for the purpose of adjusting the molecular weight or silanol content of the resin. In addition, when the SiH-functional silicone polymer molecule (ii) of the first embodiment of the present invention itself contains on average at least 2 silanol groups (SiOH) per polymer molecule, this resin can also function as the silicone polymer molecule that contains on average at least 2 silanol groups (SiOH) in each polymer molecule.

In the third embodiment of the present invention, a curable composition according to the first embodiment is exposed to radiation at a temperature from 0° C. to 200° C. in at atmosphere with a relative humidity of at least 10%. This may be followed on an optional basis by treatment for up to 5 hours at a temperature from 0° C. to 200° C. (heating, standing at ambient temperature, or cooling). In this third embodiment, catalysis by the base produced in the irradiated regions promotes the reactions that form the silicon-oxygen bond (Si—O) and molecular hydrogen ($H_2$) from the silicon-hydrogen bond (Si—H) and hydroxyl groups (OH) in subject curable composition or water molecules introduced into the curable composition from the atmosphere. Crosslink formation is thereby induced and the curable composition is thus cured.

The radiation used for this purpose includes (UV-containing) light, electron beam, x-ray, ion beam, and so forth. The exposure time is not crucial. However, in order to effectively utilize the base generator, exposure should be carried out for sufficient time to decompose a substantial portion, i.e., from 10% to 100%, of the base generator into basic catalyst.

In the fourth embodiment of the present invention, a curable composition according to the second embodiment is exposed to radiation at a temperature from 0° C. to 200° C. This may be followed on an optional basis by treatment for up to 5 hours at a temperature from 0° C. to 200° C. (heating, standing at ambient temperature, or cooling). In this fourth embodiment, catalysis by the base produced in the irradiated regions promotes the reactions that form the silicon-oxygen bond (Si—O) and molecular hydrogen ($H_2$) from the silicon-hydrogen bond (Si—H) and hydroxyl groups (OH) present in subject curable composition. Crosslink formation is thereby induced and the curable composition is thus cured.

The radiation used for this purpose includes (UV-containing) light, electron beam, x-ray, ion beam, and so forth. The exposure time is not crucial. However, in order to effectively utilize the base generator, exposure should be carried out for sufficient time to decompose a substantial portion, i.e., from 10% to 100%, of the base generator into basic catalyst.

The fifth embodiment of the present invention is a method for forming a pattern of cured material by interposing a masking pattern (mask) between the curable composition and the radiation source during the above exposure and then, after exposure and post-treatment, dissolving out (development) the uncured curable composition using inorganic or organic solvent.

This embodiment is generally implemented as follows. A solution of the curable composition is first coated on the substrate by, for example, spin coating, casting, painting, etc., and all or part of the solvent is then removed. A radiation-intercepting photomask is placed between the coated composition and the radiation source followed by exposure. Either immediately thereafter or after a post-treatment for the purpose of furthering the curing reaction, the substrate is washed with inorganic or organic solvent in order to remove uncured regions and thereby give a pattern of the cured material. The cure in the pattern of cured material can also be perfected by additional heating after drying off the solvent.

The optimal conditions for this cannot be rigorously or stringently specified due to the interdependence of a number of factors, such as the type of resin used in the present invention, molecular weight of the resin, the resin's molecular weight distribution, the resin's softening point, type of Si—H functional group, type and quantity of the base generator, type of radiation, exposure time, radiation strength, exposure temperature, humidity during exposure, and crosslinking reaction conditions after exposure (post-reaction), i.e., reaction temperature, humidity during the post-reaction, post-reaction time, etc. However, the temperature during exposure and the temperature during the post-reaction must be lower than the thermal decomposition temperature of the base generator. In addition, the reactivity of the Si—H functional group must be high enough that crosslink formation proceeds sufficiently faster than diffusion of the radiogenerated base.

Insofar as the essential organization of the present invention is not impaired, a third component, i.e., other than the base generator and SiH-functional polymer, may be added to the curable composition according to the present invention. In specific terms, a component may be added that when heated functions as a catalyst of the crosslinking reaction within the resin. This will serve to additionally promote the cure of the residual negative regions after patterning by exposure and development. Examples of this type of component are radical initiators such as peroxides, azo compounds, etc., which accelerate the cure by radical reactions, and transition metal catalysts, which catalyze the hydrosilylation reaction when heated.

EXAMPLES

The present invention is explained in greater detail through the working and reference examples provided below, but the present invention is not limited by these examples. $^{29}Si\{1H\}$-NMR denotes the silicon-29 nuclear magnetic resonance spectrum (proton decoupled) in the product property descriptions in the examples below. Quantitative $^{29}Si$-NMR measurements were run with the addition of tris(acetylacetonate)chromium(III) to a deuterochloroform ($CDCl_3$) solution of the sample. The details are reported in *The Analytical Chemistry of Silicones*, edited by A. Lee Smith, John Wiley & Sons, Inc. (1991), page 377. As described therein, the a:b:c ratio can be determined as the ratio of the relative intensities corresponding to the various functional groups in the $^{29}Si$-NMR. The functional group giving rise to the signal is provided in parentheses in the NMR data. The chemical shifts in the $^{29}Si$-NMR spectra were assigned by using 0 ppm for the chemical shift of silicon in a tetramethylsilane external standard ($CDCl_3$ solution)

Exposure was carried out using a high-pressure mercury lamp from Daika Kogyo Kabushiki Kaisha (equipped with a water-cooled jacket, 100 V, 100 W). The lamp was separated from the irradiated surface by a distance of 10 cm. The UV intensity at this distance was 2 millijoule/$cm^2$. The photomask was a quartz plate on which parallel lines were drawn (line width=0.3 mm, interval=2 mm).

In Examples 10 to 14, however, a homogeneous irradiation UV light source (a "Kinitsu-kun" 200-watt mercury-xenon lamp from Yamashita Denso Kabushiki Kaisha) was used as the light source. It was placed 30 cm from the surface receiving the radiation, and the UV intensity at this distance was 7.5 milliwatt/$cm^2$ (measured at 254 nm). In addition, the photomask used in Examples 10 to 14 was a Toppan Test Chart No. 1-P/N (pattern line width from 50 micrometers to 0.877 micrometer). Finally, in Examples 10, 11, and 12, a UIS-500C Lamp House (500-watt mercury-xenon lamp from Ushio Denki Kabushiki Kaisha) was used for UV irradiation (UV intensity: 1 mJ/cm$^2$ to 1 J/cm$^2$, wavelength: 254 nm) in the determination of the 50% residual film thickness sensitivity (D50) and contrast (gamma).

GPC refers to gel permeation chromatography, and Mn refers to the number-average molecular weight on a polystyrene basis. The polyhydrogensilsesquioxane was obtained from the Dow Corning Corporation (Midland, Mich., USA). In the following reference and working examples, Ph is an abbreviation for phenyl, and Me is an abbreviation for methyl.

The molecular weight determined by GPC for silicones containing the diphenylsiloxane unit and the like tends to be somewhat smaller than the actual molecular weight. When such silicones contain the silanol group, the molecular weight afforded by GPC tends to be only slightly different from the actual molecular weight.

Reference Example 1

Base Generator Synthesis 100 mL toluene, 10 g 2-nitrobenzyl alcohol and 11.4 mL octyl isocyanate were introduced into a 200-mL roundbottom flask and heated under reflux for 2 hours under a nitrogen blanket. After cooling, the reaction solution was washed several times with water, and the toluene solution thereby afforded was then dried over sodium sulfate. The sodium sulfate was thereafter filtered off and the solvent was eliminated from the filtrate using a rotary evaporator. The resulting solid was recrystallized twice from hexane to yield 12.5 g ortho-nitrobenzyl n-octylcarbamate as light-yellow, needle-like crystals. mp=70°–71° C. Infrared absorption= 3331 cm$^{-1}$, 1691 cm$^{-1}$.

Reference Example 2

Base Generator Synthesis 10 mL toluene, 3.1 g 2-nitrobenzyl alcohol, and 2.5 g cyclohexylisocyanate were introduced into a 100-mL three-neck flask and heated under reflux for 1 hour under nitrogen. After cooling, an additional 0.5 g cyclohexylisocyanate was added and the reaction was stirred for 1 hour at ambient temperature. The reaction solution was then washed several times with water and the resulting toluene solution was dried over sodium sulfate. The sodium sulfate was thereafter filtered off and the solvent was eliminated from the filtrate on a rotary evaporator. The resulting solid was recrystallized from toluene to yield ortho-nitrobenzyl cyclohexylcarbamate as light-yellow, needle-like crystals. mp=101°–102° C. Identification by the proton NMR spectrum.

Reference Example 3

Synthesis of Diphenylsiloxane-Hydrogensilsescruioxane Resin 100 mL ether and 16.8 mL trichlorosilane were introduced into a nitrogen-filled 300-mL three-neck flask, which was then cooled to −78° C. 30 g diphenylsilanediol dissolved in 22.5 mL pyridine was added over a period of 10 minutes while stirring well. The temperature was raised to room temperature while stirring and the reaction was subsequently stirred for an additional 1 hour. Once the solution had been cooled back to 0° C., 50 mL water was added while stirring vigorously. After stirring for an additional 30 minutes, 200 mL ether was added to the reaction mixture and the organic layer was washed several times with water. The addition of hexane followed by filtration and then elimination of the solvent at room temperature gave 27 g of a transparent resin. This resin was dissolved in toluene (20 weight % solution) and heated under reflux for 30 minutes to afford the solution used in the ensuing reaction.

Infrared absorption: 2239 cm$^{-1}$ (Si—H), 3200–3700 cm$^{-1}$ (SiOH)

$^{29}$Si{1H}-NMR (CDCl$_3$), delta (functional group, relative intensity) −38 to −47 ppm (Ph$_2$SiO, 10), −73 to −79 ppm (HSiO(OH), 2.0), −80 to −83 ppm (HSiO$_{3/2}$, 10.3)

Reference Example 4

Synthesis of Diphenylsiloxane-Methylsilsesquioxane-Hydrogensilsesquioxaneresin

This synthesis was run by the same procedure as in Reference Example 3, but in this case using 9.8 mL methyltrichlorosilane and 8.4 mL trichlorosilane in place of the 16.8 mL trichlorosilane. 32 g of a transparent resin was obtained.

Molecular weight by GPC (polystyrene basis) Mn=3,720

Infrared absorption: 2230 cm$^{-1}$ (Si—H), 1128 cm$^{-1}$ (Si—Ph), 1092 cm$^{-1}$ (Si—Me)

$^{29}$Si-NMR (CDCl$_3$), delta (functional group, relative intensity): −32 to −48 ppm (Ph$_2$SiO 10), −53 to −57 ppm (MeSiO(OH), 2.8), −62 to −67 (MeSiO$_{3/2}$, 2.9), −71 to −86 ppm (HSiO$_{3/2}$, 5.4)

Reference Example 5

Synthesis of Diphenylsiloxane-Hydrogensilsesquioxane-Dimethylsiloxy Resin 40 mL toluene and 10 g of the diphenylsiloxane-hydrogensilsesquioxane resin prepared in Reference Example 3 were introduced into a nitrogen-filled 100-mL three-neck flask. To this was then added first 5 mL pyridine and then 3 mL dimethylchlorosilane. After stirring for 5 minutes at room temperature, the temperature was raised over a period of 20 minutes and the reaction was heated under reflux for 15 minutes. After then cooling the reaction solution back to room temperature, 4 mL acetic acid dissolved in 22 mL water was added and the reaction mixture was stirred for 5 minutes. 150 mL toluene was added, and the organic layer was then washed with water and concentrated aqueous sodium carbonate solution and then several times with water. The organic layer was thereafter separated off and the solvent and volatile components were eliminated by distillation to yield a viscous gum-like substance that exhibited a moderate white turbidity.

Molecular weight (polystyrene basis) Mn=4,400

Infrared absorption: 2238 cm$^{-1}$ (Si—H), 2135 cm$^{-1}$ (Si—H), 1126 cm$^{-1}$ (Si—Ph)

Reference Example 6

Synthesis of Diphenylsiloxane-Phenylsilsesquioxane-Hydrogensilsesquioxaneresin

The procedure of Reference Example 3 was used. In this case, however, 20 g diphenylsilanediol, 8.84 mL phenyltrichlorosilane, 5.61 mL trichlorosilane were used, and 66 mL ether was used as the solvent. Isolation and purification afforded 25 g of a very viscous resin.

Molecular weight by GPC (polystyrene basis) Mn=1,870

Infrared absorption: 3200–3600 cm$^{-1}$ (SiOH), 2234 cm$^{-1}$ (Si—H), 1130 cm$^{-1}$ (Si—Ph) 1094 cm$^{-1}$ (Si—O)

$^{29}$Si-NMR (CDCl$_3$), delta (functional group, relative intensity): –33 to –46 ppm (Ph$_2$SiO, 10), –66 to –85 ppm (HSiO$_{3/2}$ and PhSiO$_{3/2}$, 12.4)

Reference Example 7

Synthesis of Phenylsilsesquioxane-Hydrogensilsesquioxane Resin 25 g dioxane, 22.11 g phenyltrichlorosilane, and 2.5 g trichlorosilane were introduced into a nitrogen-filled 300-mL three-neck flask. After the flask had been cooled on an ice bath, 6 g water dissolved in 20 mL dioxane was added over 10 minutes. After then stirring for 30 minutes at room temperature, the temperature was raised over a period of 20 minutes and the reaction mixture was heated for 15 minutes under reflux. After the reaction solution had then been cooled back to room temperature, 22 mL water was added and the reaction was stirred for 5 minutes. 150 mL toluene was added and the organic layer was thereafter washed with water, concentrated aqueous sodium carbonate solution, and several times with water. The organic layer was subsequently separated off and the solvent and volatile components were eliminated by distillation to yield a viscous gum-like substance that exhibited a moderate white turbidity.

Molecular weight (polystyrene basis) Mn=4,400

Infrared absorption: 2238 cm$^{-1}$ (Si—H), 1126 cm$^{-1}$ (Si—Ph)

Reference Example 8

Synthesis of Hydrogendimethoxysiloxy-Endblocked Dimethylsiloxane 15.0 g silanol-terminated dimethylsiloxanediol (average degree of polymerization=10.4), 2.79 g trimethoxysilane, and 0.05 g dimethyldichlorosilane were added to a nitrogen-filled 100-mL three-neck flask. After stirring for 1 hour at room temperature, the volatiles were eliminated by stirring for 0.5 hour under a vacuum. 0.5 g sodium carbonate was added for chloride removal and the reaction mixture was stirred over night. 50 mL hexane was then added and the sodium carbonate was removed by filtration. The hexane was pulled off on a rotary evaporator to give 12.0 g hydrogendimethoxysiloxy-endblocked dimethylsiloxane polymer.

Molecular weights (polystyrene basis) Mn=3,300, Mw=6,900

Infrared absorption: 2218 cm$^{-1}$ (Si—H). No absorption due to the silanol on the starting siloxanediol (3,350 cm$^{-1}$ region) was observed.

$^{1}$H-NMR (d-chloroform): 0.05 to 0.1 ppm (methyl group), 3.5 to 3.6 ppm (methoxy group), 4.2 to 4.4 ppm (Si—H)

Reference Example 9

Polyhydrogensilsesquioxane

The polyhydrogensilsesquioxane was obtained from the Dow Corning Corporation of Midland, Mich., U.S.A. Its values were as follows:

molecular weight: Mn=16000, Mw/Mn=approximately 2.5 infrared absorption: 2264 cm$^{-1}$ (Si—H), free of absorption originating in Si—OH.

Reference Example 10

Preparation of Diphenylsiloxane-Methylsilsesquioxane Resin 42.7 g methyltrichlorosilane was introduced into a nitrogen-filled 500-mL three-neck flask and cooled to 0° C. 46.4 g diphenylsilanediol dissolved in 37.4 g pyridine was then added over a period of 10 minutes while stirring well. The temperature was then raised to room temperature while stirring the reaction mixture, and the reaction was subsequently stirred for an additional 1 hour. 93 mL toluene was added to the solution, followed by the addition of 200 mL water while stirring vigorously and then stirring for an additional 30 minutes. After 200 mL ether had been added to the reaction mixture, the organic layer was washed several times with water. This was followed by the addition of hexane, filtration, and removal of the solvent at room temperature to give 54.7 g resin. This resin was dissolved in toluene (20 weight % solution) and heated under reflux for 30 minutes to afford the solution used for the ensuing reaction.

Infrared absorption: 3000 to 3600 cm$^{-1}$ (SiOH), 1127 cm$^{-1}$ (Si—Ph), 1030 cm$^{-1}$ 1090 cm$^{-1}$ (Si—O)

$^{29}$Si-NMR (CDCl$_3$): –35 to –47 ppm (Ph$_2$SiO), –50 to –60 ppm (MeSiO(OH)), –60 to –70 ppm (MeSiO$_{3/2}$)

Reference Example 11

Preparation of Poly(Allylsilsesquioxane) Resin

This was synthesized from allyltrichlorosilane using the method described in U.S. Pat. No. 4,826,943.

Infrared absorption: 3000 to 3600 cm$^{-1}$ (SiOH), 1620 cm$^{-1}$ (allyl), 1380 cm$^{-1}$ (Si-allyl), 1030 cm$^{-1}$, 1090 cm$^{-1}$ (Si—O)

$^{29}$Si-NMR (CDCl$_3$): –52 to –62 ppm (CH$_2$=CHCH$_2$SIO(OH)), –62 to –71 ppm (CH$_2$=CHCH$_2$SiO$_{3/2}$)

GPC (polystyrene basis) Mn=3,500, Mw=5,600

Reference Example 12

Synthesis of UV-Activated Base Generator 12 g nifedipine was introduced into a 100-mL three-neck flask and dissolved in 50 mL tetrahydrofuran under nitrogen. 1.66 g of a 60% dispersion of sodium hydride in oil was then added with stirring. After stirring for a short period of time, 10 mL methyl iodide was added and the reaction was stirred for 1 hour at 38° C. 200 mL ethyl acetate was then added, and the organic layer was thereafter washed several times with water and dried over sodium sulfate. The sodium sulfate was subsequently filtered off and the solvent was then pulled off from the filtrate on a rotary evaporator. The obtained solid was dissolved in 200 mL MIBK, and the addition of hexane to this solution then yielded 8.9 g N-methylnifedipine as yellow crystals. mp=184°–187° C.

Identified by:

Infrared absorption spectrum: 1690 cm$^{-1}$ (C=O), 1524 cm$^{-1}$ (N—O)

proton-NMR spectrum (solvent: CDCl$_3$): 2.5 (6H, methyl), 3.3 (3H, N-methyl), 3.6 (6H, O-methyl), 5.7 (1H, C—H), 7.2–7.6 (4H, aromatic ring C—H).

Reference Example 13

Synthesis of Polyphenylsilsesquioxane-Hydrogensilsesquioxane Resin 170 mL dioxane, 15.4 g phenyltrichlorosilane, and 9.75 g trichlorosilane were introduced into a nitrogen-filled 300- mL three-neck flask. After first cooling on a water bath, 8.2 g water dissolved in 60 mL dioxane was added over a period of 30 minutes. After stirring for 30 minutes at room temperature, the solvent was eliminated on a rotary evaporator. The residue was dissolved in 100 mL toluene and the organic layer was washed several times with water. After the organic layer had been dried over sodium sulfate, the solvent and volatile components were distilled off in a vacuum at 60° C. to yield a white solid. Molecular weight (Mw, polystyrene basis)=630.

infrared absorption: 2253 cm$^{-1}$ (Si—H), 3358 cm$^{-1}$ (SiOH), 1163–1061 cm$^{-1}$ (Si—O—Si)

Reference Example 14

Synthesis of Polycyclohexylsilsesquioxane-Hydrogensilsesquioxane Resin 78 g dioxane, 15.1 g cyclohexyltrichlorosilane, and 6.58 g trichlorosilane were introduced into a nitrogen-filled 300-mL three-neck flask. After first cooling on a water bath, 6.23 g water dissolved in 23.7 g dioxane was added over a period of 30 minutes. After stirring for 1 hour at room temperature, the solvent was eliminated on a rotary evaporator. The residue was dissolved in 100 mL toluene and the organic layer was washed several times with water. After the organic layer had been dried over sodium sulfate, the solvent and volatile components were distilled off in a vacuum to yield 14 g of a white solid.

Infrared absorption: 2249 cm$^{-1}$ (Si—H), 2924 cm$^{-1}$ (C—H), 2851 cm$^{-1}$ (C—H), 3383 cm$^{-1}$ (SiOH), 1113–1067 cm$^{-1}$ (Si—O—Si).

The following composition was obtained for this resin by $^{1}$H-, $^{13}$C-, and $^{29}$Si-NMR spectroscopy.

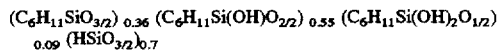

Reference Example 15

Preparation of Diphenylsiloxane-Methylhydrogensiloxane Copolymer 11.8 g methyldichlorosilane was introduced into a nitrogen-filled 1-L three-neck flask and then cooled to 0° C. 22.1 g diphenylsilanediol dissolved in 15.9 g pyridine was then added over a period of 10 minutes with thorough stirring. The temperature of the reaction was then raised to room temperature while stirring and the reaction was stirred for an additional 1 hour. 150 mL toluene was added to the solution; 400 mL water was then added with vigorous stirring; and the reaction was thereafter stirred for an additional 30 minutes. The organic layer was separated, washed several times with water, and then dried over sodium sulfate. After filtration, the solvent was eliminated on a rotary evaporator to yield 26.9 g polymer. This polymer dissolved in 50 mL toluene was poured into 200 mL methanol, and the high-molecular-weight polymer was collected as the precipitate. Vacuum drying of this precipitate yielded 15.1 g polymer.

Infrared absorption: 3071 to 3051 cm$^{-1}$ (C—H), 2164 cm$^{-1}$ (Si—H), 1593 cm$^{-1}$, 1429 cm$^{-1,}$ 1260 cm$^{-1}$, 1130–1020 cm$^{-1}$ (Si—O).

GPC analysis: Mn=5900, Mw=9000.

Reference Example 16

Preparation of Phenylsilsesquioxane-Methylhydrogensiloxane Copolymer 200 mL ether, 8.0 mL phenyltrichlorosilane, and 5.2 mL methyldichlorosilane were introduced into a nitrogen-filled 500-mL three-neck flask and then cooled to 0° C. 7 g water dissolved in 15 mL ether was then added over a period of 10 minutes with thorough stirring. The temperature of the reaction was then raised to room temperature while stirring and the reaction was stirred for an additional 1 hour. After the solvent had been eliminated on a rotary evaporator, 100 mL toluene was added and this was washed several times with water. Drying over sodium sulfate, filtration, and elimination of the solvent on a rotary evaporator yielded 8 g polymer. This polymer dissolved in 5 mL toluene was poured into 200 mL methanol with vigorous stirring, and the high-molecular-weight polymer was collected as the precipitate. Vacuum drying of this precipitate yielded 5 g polymer.

GPC molecular weight (polystyrene basis): 4300 g/mol.

Infrared absorption: 3630, 3420 cm$^{-1}$ (Si—OH), 2230 cm$^{-1}$ (Si—H), 1128 cm$^{-1}$ (Si—Ph), 1092 cm$^{-1}$ (Si—Me)

Example 1

Photocuring of the Diphenylsiloxane-Hydrogensilsesquioxane Resin

The photodecomposable base generator (hereinafter abbreviated as the photobase) synthesized in Reference Example 1, i.e., ortho-nitrobenzyl n-octylcarbamate, was dissolved at 10 weight % (based on resin) in a 20% toluene solution of the diphenylsiloxane-hydrogensilsesquioxane resin prepared in Reference Example 3. This solution was spin coated (1,000 rpm, 5 seconds) on a silicon wafer and dried at ambient temperature. A photomask was laid on the resin-coated surface of the silicon wafer, and exposure to UV radiation was then carried out for 3 minutes using the 100-watt high-pressure mercury lamp. When the silicon wafer was thereafter washed with toluene and dried, a precise pattern was obtained in the resin that corresponded to a negative of the photomask. Absolutely no residual resin was observed in the unexposed regions, which meant that absolutely no curing had occurred in these regions.

Use of the ortho-nitrobenzyl cyclohexylcarbamate synthesized in Reference Example 2 as the photobase in the procedure described above gave the same results as for use of the ortho-nitrobenzyl n-octylcarbamate.

Example 2

Photocuring of the Diphenylsiloxane-Methylsilsesquioxane-Hydrogensilsesquioxaneresin The ortho-nitrobenzyl n-octylcarbamate synthesized in Reference Example 1 was dissolved at 5 weight % (based on resin) in a 20% toluene solution of the diphenylsiloxane-methylsilsesquioxane-hydrogensilsesquioxane resin prepared in Reference Example 4. This solution was spin coated on a silicon wafer and dried at ambient temperature. A photomask was laid on the resin-coated surface of the silicon wafer, and exposure to UV radiation was then carried out for 3 minutes using the 100-watt high-pressure mercury lamp. When the silicon wafer was thereafter washed with toluene and dried, a precise pattern was obtained in the resin that corresponded to a negative of the photomask. Absolutely no residual resin was observed in the unexposed regions, which meant that absolutely no curing had occurred in these regions.

Example 3

Photocuring of the Diphenylsiloxane-Hydrogensilsesquioxane-Dimethylsiloxy Resin

The ortho-nitrobenzyl n-octylcarbamate synthesized in Reference Example 1 was dissolved at 10 weight % (based on resin) in a 20% toluene solution of the diphenylsiloxane-hydrogensilsesquioxane-dimethylsiloxy resin prepared in Reference Example 5. This solution was spin coated (1,000 rpm, 5 seconds) on a silicon wafer and dried at ambient temperature. A photomask was laid on the resin-coated surface of the silicon wafer, and exposure to UV radiation was then carried out for 5 minutes using the 100-watt high-pressure mercury lamp. When the silicon wafer was thereafter washed with toluene and dried, a precise pattern was obtained in the resin that corresponded to a negative of the photomask. Absolutely no residual resin was observed in the unexposed regions, which meant that absolutely no curing had occurred in these regions.

Example 4

Photocuring of the Diphenylsiloxane-Phenylsilsesquioxane-Hydrogensilsesquioxaneresin The photobase synthesized in Reference Example 1 (ortho-nitrobenzyl n-octylcarbamate) was dissolved at 5 weight % (based on resin) in a 20% toluene solution of the diphenylsiloxane-phenylsilsesquioxane-hydrogensilsesquioxaneresin prepared in Reference Example 6. This solution was spin coated on a silicon wafer and dried at ambient temperature. A photomask was laid on the resin-coated surface of the silicon wafer, and exposure to UV radiation was then carried out for 5 minutes using the 100-watt high-pressure mercury lamp. When this silicon wafer was thereafter heated at 80° C. for 1 minute on a hot stage (Mettler), cooled, washed with toluene, and dried, a pattern was obtained in the resin that corresponded to a negative of the photomask Absolutely no residual resin was observed in the unexposed regions, which meant that absolutely no curing had occurred in these regions.

Example 5

Photocuring of the Phenylsilsesquioxane-Hydrogensilsesquioxane Resin

The photobase synthesized in Reference Example 1 (ortho-nitrobenzyl n-octylcarbamate) was added at 2 weight % based on the resin to the polyphenylsilsesquioxane-hydrogensilsesquioxane resin of Reference Example 7. This mixture was dissolved in toluene to prepare the 20 weight % solution. This solution was filtered across a filter with a pore size of 0.45 micrometer and then spin coated (1,000 rpm, 5 seconds) on a silicon wafer. After drying at ambient temperature, a photomask was laid on the resin-coated surface of the silicon wafer, and exposure to ultraviolet radiation was carried out for 3 minutes using the 100-watt high-pressure mercury lamp. When this silicon wafer was then washed with toluene and dried, a pattern was obtained in the resin that corresponded to a negative of the photomask. Absolutely no residual resin was observed in the unexposed regions, which meant that absolutely no curing had occurred in these regions.

Example 6

Photocuring of the Hydrogendimethoxysiloxy-Endblocked Dimethylsiloxane

The photobase synthesized in Reference Example 1 (ortho-nitrobenzyl n-octylcarbamate) was added at 2 weight % based on the siloxane to the hydrogendimethoxysiloxy-endblocked dimethylsiloxane of Reference Example 8. This mixture was dissolved in toluene to prepare the 20 weight % solution. This solution was filtered across a filter with a pore size of 0.45 micrometer and then spin coated (1,000 rpm, 5 seconds) on a silicon wafer. A photomask was laid on the silicone-coated surface of the silicon wafer, and exposure to ultraviolet radiation was carried out for 10 minutes using the 100-watt high-pressure mercury lamp. This was followed by heating for 10 minutes at 150° C. This process yielded a coating that was not tacky or sticky, which indicated that curing had occurred.

Example 7

Photocuring of the Polyhydrogensilsesquioxane

The photobase synthesized in Reference Example 1 (ortho-nitrobenzyl n-octylcarbamate) was added at 2 weight % based on the resin to the polyhydrogensilsesquioxane of Reference Example 9. This mixture was dissolved in toluene to prepare the 20 weight % solution. This solution was filtered across a filter with a pore size of 0.45 micrometer and then spin coated (1,000 rpm, 5 seconds) on a silicon wafer. After drying at ambient temperature, a photomask was laid on the resin-coated surface of the silicon wafer, and exposure to ultraviolet radiation was carried out for 3 minutes using the 100-watt high-pressure mercury lamp. When this silicon wafer was then washed with toluene and dried, a pattern was obtained in the resin that corresponded to a negative of the photomask. Absolutely no residual resin was observed in the unexposed regions, which meant that absolutely no curing had occurred in these regions.

Example 8

Photocuring of the Diphenylsiloxane-Hydrogensilsesquioxane-Dimethylsiloxy Resin with Diphenylsiloxane-Methylsilsesquioxane Resin as Crosslinker To the mixture of 6 parts of the diphenylsiloxane-methylsilsesquioxane resin of Reference Example 10 and 4 parts diphenylsiloxane-hydrogensilsesquioxane-dimethylsiloxy resin of Reference Example 5 was added ortho-nitrobenzyl n-octylcarbamate (Reference Example 1) to give 5 weight % based on resin. This mixture was dissolved in toluene to give the 20 weight % solution. This solution was spin coated (1,000 rpm, 5 seconds) on a silicon wafer. After drying at ambient temperature, a photomask was laid on the resin-coated surface of the silicon wafer, and exposure to ultraviolet radiation was carried out for 3 minutes using the 100-watt high-pressure mercury lamp. When this silicon wafer was then washed with toluene and dried, a pattern was obtained in the resin that corresponded to a negative of the photomask. Absolutely no residual resin was observed in the unexposed regions, which meant that absolutely no curing had occurred in these regions.

Example 9

Photocuring of the Mixture of Poly(allylsilsesquioxane) Resin and Polyhydrogensilsesquioxane To the mixture of 9 parts of the poly(allylsilsesquioxane) resin of Reference Example 11 and 1 part polyhydrogensilsesquioxane of Reference Example 9 was added ortho-nitrobenzyl n-octylcarbamate (Reference Example 1) at 5 weight % based on the polyhydrogensilsesquioxane. This mixture was dissolved in toluene to give the 20 weight % solution. This solution was spin coated (1,000 rpm, 5 seconds) on a silicon wafer. After drying at ambient temperature, a photomask was laid on the resin-coated surface of the silicon wafer, and exposure to ultraviolet radiation was carried out for 3 minutes using the 100-watt high-pressure mercury lamp. When this silicon wafer was then washed with methyl isobutyl ketone and dried, a pattern was obtained in the resin that corresponded to a negative of the photomask.

EXAMPLE 10

Photopatterning of Phenylsilsesquioxane-Hydrogensilsesquioxane Resin

The N-methylnifedipine photobase synthesized in Reference Example 12 was added at 1 weight % on resin to the polyphenylsilsesquioxane-hydrogensilsesquioxane resin synthesized in Reference Example 13. This mixture was dissolved in toluene to prepare the 20 weight % solution. After this solution had been filtered across a filter with a pore size of 0.45 micrometer, it was spin coated (1,000 rpm, 5 seconds) on a silicon wafer, then dried at ambient temperature, and thereafter prebaked for 1 minute at 80° C. The film thickness of the coating was 1 micron. The wafer was divided into 8 regions and exposed to UV light at from 1 mJ/cm$^2$ to 1 J/cm$^2$ (measured at 254 nm). After the end of exposure, the sample was postbaked for 1 minute at 100° C. and then developed for 1 minute with toluene. After drying the sample, the film thickness in each region was measured. A characteristic curve was constructed for the relationship between exposure dose and residual film thickness, from which the 50% residual film thickness sensitivity (D50) and contrast (gamma) were determined. Values of D50=4.3 mJ/cm$^2$ and gamma=11.4 were obtained.

Patterning

A silicon wafer sample was prepared by spin coating the above-described solution of the composition under the same conditions as above. After the specified prebaking, the photomask was overlaid and exposure to UV light was carried out for 5 seconds using the homogeneous irradiation UV light source (200-watt mercury-xenon lamp). When the silicon wafer was thereafter washed with toluene and dried, a precise pattern was obtained in the resin that corresponded to a negative of the photomask. Absolutely no residual resin was observed in the unexposed regions, which meant that absolutely no curing had occurred in these regions. A resolution of 4 microns was determined by microscopic observation of the line/space patterns. When this silicon wafer was also heated for 5 minutes at 150° C., silanol condensation was induced and the resin was cured and became toluene insoluble. Infrared absorption originating with silanol (3650 cm$^{-1}$) was reduced to approximately one-fifth. The resin pattern remained unchanged.

Example 11

Photopatterning of Cyclohexylsilsesquioxane-Hydrogensilsesquioxane Resin

The photobase (N-methylnifedipine) synthesized in Reference Example 12 was added at 2 weights on resin to the polycyclohexylsilsesquioxane-hydrogensilsesquioxane resin synthesized in Reference Example 14. This mixture was dissolved in toluene to prepare the 20 weight % solution. After this solution had been filtered across a filter with a pore size of 0.45 micrometer, it was spin coated (500 rpm, 5 seconds, 1,500 rpm, 15 seconds) on a silicon wafer and then prebaked for 1 minute at 80° C. The film thickness of the coating was 1.3 microns. Values of D50=4 mJ/cm$^2$ and gamma=1.8 were obtained by the same methods as in Example 10.

A silicon wafer sample was prepared by spin coating the above-described solution of the composition under the same conditions as above. After the specified prebaking, the photomask was overlaid and exposure to UV light was carried out for 5 seconds using the homogeneous irradiation UV light source (200-watt mercury-xenon lamp). When the silicon wafer was thereafter washed with toluene and dried, a precise pattern was obtained in the resin that corresponded to a negative of the photomask. Absolutely no residual resin was observed in the unexposed regions, which meant that absolutely no curing had occurred in these regions. A resolution of 4 microns was determined by microscopic observation of the line/space patterns.

Example 12

Photopatterning of Polyhydrogensilsesquioxane

The photobase (N-methylnifedipine) synthesized in Reference Example 12 was added at 0.5 weight % on resin to the polyhydrogensilsesquioxane synthesized in Reference Example 9. This mixture was dissolved in methyl isobutyl ketone to prepare the 20 weight % solution. After this solution had been filtered across a filter with a pore size of 0.45 micrometer, it was spin coated (1,000 rpm, 5 seconds) on a silicon wafer, dried at ambient temperature, and then prebaked for 1 minute at 80° C. The film thickness of the coating was 1.0 micron. Values of D50=18 mJ/cm$^2$ and gamma=7.1 were obtained by the same methods as in Example 10.

A silicon wafer sample was prepared by spin coating the above-described solution of the composition under the same conditions as above. After the specified prebaking, the photomask was overlaid and exposure to UV light was carried out for 5 seconds using the homogeneous irradiation UV light source (200-watt mercury-xenon lamp). When the silicon wafer was thereafter washed with toluene and dried, a precise pattern was obtained in the resin that corresponded to a negative of the photomask. Absolutely no residual resin was observed in the unexposed regions, which meant that absolutely no curing had occurred in these regions. A resolution of 4 microns was determined by microscopic observation of the line/space patterns. When this pattern was heated for 1 hour at 400° C. in nitrogen, the pattern was retained intact and the resin became vitrified.

Example 13

Photopatterning of Diphenylsiloxane-Methylhydrogensiloxane Copolymer

The photobase (N-methylnifedipine) synthesized in Reference Example 12 was added at 2 weight % on resin to the diphenylsiloxane-methylhydrogensiloxane copolymer synthesized in Reference Example 15. This mixture was dissolved in methyl isobutyl ketone to prepare the 20 weight % solution. After this solution had been filtered across a filter with a pore size of 0.45 micrometer, it was spin coated (1,000 rpm, 5 seconds) on a silicon wafer, dried at ambient temperature, and then prebaked for 1 minute at 80° C. The film thickness of the coating was 1 micron. The photomask was then overlaid and exposure to UV light was carried out for 10 seconds using the homogeneous irradiation UV light source (200-watt mercury-xenon lamp). When the silicon wafer was thereafter washed with toluene and dried, a precise pattern was obtained in the resin that corresponded to a negative of the photomask. Absolutely no residual resin was observed in the unexposed regions, which meant that absolutely no curing had occurred in these regions. A resolution of 50 microns was determined by microscopic observation of the line/space patterns.

Example 14

Photopatterning of Phenylsilsesquioxane-Methylhydrogensiloxane Copolymer

The photobase (N-methylnifedipine) synthesized in Reference Example 12 was added at 2 weight % on resin to the phenylsilsesquioxane-methylhydrogensiloxane copolymer synthesized in Reference Example 16. This mixture was dissolved in methyl isobutyl ketone to prepare the 20 weight % solution. After this solution had been filtered across a filter with a pore size of 0.45 micrometer, it was spin coated (1,000 rpm, 5 seconds) on a silicon wafer; dried at ambient temperature, and then prebaked for 1 minute at 80° C. The film thickness of the coating was 1 micron. The photomask was then overlaid and exposure to UV light was carried out for 1 second using the homogeneous irradiation UV light source (200-watt mercury-xenon lamp). After postbaking for 1 minute at 80° C., the silicon wafer was washed with toluene and dried to yield a precise pattern in the resin that corresponded to a negative of the photomask. Absolutely no residual resin was observed in the unexposed regions, which meant that absolutely no curing had occurred in these regions. A resolution of 20 microns was determined by microscopic observation of the line/space patterns.

Comparative Example 1

Photocuring of the Diphenylsiloxane-Methylsilsesquioxane Resin

The ortho-nitrobenzyl n-octylcarbamate synthesized in Reference Example 1 was dissolved at 5 weight % (based on resin) in a 20% toluene solution of the diphenylsiloxane-methylsilsesquioxane resin prepared in Reference Example 10. This solution was spin coated on a silicon wafer and dried at ambient temperature. A photomask was laid on the resin-coated surface of the silicon wafer, and exposure to UV radiation was then carried but for 5 minutes using the 100-watt high-pressure mercury lamp. This silicon wafer was thereafter heated at 80° C. for 1 minute on a hot stage (Mettler), cooled, and washed with toluene. All of the resin was dissolved and removed, which indicated that curing had not occurred.

Comparative Example 2

Photocuring of the Poly(allylsilsesquioxane) Resin

The ortho-nitrobenzyl n-octylcarbamate synthesized in Reference Example 1 was dissolved at 5 weight % (based on resin) in a 20% toluene solution of the poly (allylsilsesquioxane) resin prepared in Reference Example 11. This solution was spin coated on a silicon wafer and dried at ambient temperature. A photomask was laid on the resin-coated surface of the silicon wafer, and exposure to UV radiation was then carried out for 5 minutes using the 100-watt high-pressure mercury lamp. This silicon wafer was thereafter heated at 150° C. for 10 minutes, cooled, and washed with toluene. All of the resin was dissolved and removed, which indicated that curing had not occurred.

That which is claimed is:

1. A curable composition comprising
   (i) a substance that produces a base when exposed to radiation;
   (ii) a hydroxyl-functional crosslinker selected from the group consisting of water, silane compounds that have at least 2 silanol groups per molecule, silicone polymer molecules that contain on average at least 2 silanol groups in each polymer molecule, and organic compounds that contain on average at least 2 hydroxyl groups per molecule; and
   (iii) a polymer molecule that contains silicon-hydrogen bonds which react with the hydroxyl groups of component (ii) under the action of the base to form silicon-oxygen bonds and hydrogen molecules,
   wherein the substance that produces the base is present at from 0.01 to 50 weight % based on the total weight of the composition and is selected from the group consisting of benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, and 4-(ortho-nitrophenyl) dihydropyridines, and
   wherein each polymer molecule contains on average at least 2 silicon atoms that have 1 silicon-hydrogen bond and at least 2 silicon-oxygen bonds.

2. The composition of claim 1 wherein the polymer molecule is selected from the group consisting of silicone polymer molecules and silicone-modified organic resins.

3. The composition of claim 1 wherein the substance that produces the base is selected from the group consisting of
   (A) benzyl carbamates with the structure $BzCH_2OC(=O)NR^3R^4$ wherein Bz represents a benzyl group and in which a nitro group is substituted at position 2 or at positions 2 and 6 of the benzyl group, a methoxy group is optionally substituted at position 4 or 5 of the benzyl group, $R^3$ is H, $C_1$ to $C_{10}$ alkyl, aralkyl, or aryl, and $R^4$ is $C_1$ to $C_{10}$ alkyl, aralkyl, or aryl;
   (B) benzoin carbamates $ArC(=O)CHArOC(=O)NR^5R^6$ in which Ar is phenyl, $R^5$ is a hydrogen atom and $R^6$ is $C_5$ to $C_{10}$ alkyl;
   (C) O-carbamoylhydroxyamines $R^7R^8NOC(=O)NR^9R^{10}$ in which $R^7$ and $R^8$ are bonded with each other to give a phthaloyl group, $R^9$ is a hydrogen atom, and $R^{10}$ is $C_5$ to $C_{10}$ alkyl; and
   (D) 4-(ortho-nitrophenyl)dihydropyridines in which a methyl or ethyl group is bonded at position 1 of the dihydropyridine and a methoxycarbonyl group is bonded at positions 3 and 5 of the dihydropyridine; and
   wherein the substance that produces the base is present at 0.1 to 25 weight % of the composition.

4. The curable composition of claim 2 wherein the organic resin of the silicon modified organic resin is selected from the group consisting of alkyd resins, polyester resins, acrylic resins, epoxy resins, phenolic resins and polyimide resins.

5. The curable composition of claim 1 wherein the polymer molecule is a silicone polymer molecule of the following general formula

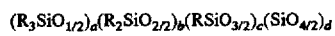

wherein each R is a monovalent radical independently selected from the group consisting of a hydrogen atom, a trifluoropropyl group, a trimethylsilyl group, a methoxy group, and $C_1$ to $C_8$ hydrocarbon groups, with the proviso that in each polymer molecule R is the hydrogen atom on average in at least 2 of the $R_2SiO_{2/2}$ and $RSiO_{3/2}$ considered collectively; the divalent oxygen atom bonded to silicon in $R_3SiO_{1/2}$ is bonded to another silicon atom; at least 1 of the divalent oxygen atoms bonded to silicon in $R_2SiO_{2/2}$, $RSiO_{3/2}$, and $SiO_{4/2}$ is bonded to another silicon and the remaining oxygen are bonded to another silicon, hydrogen, $C_1$ to $C_6$ alkyl, $C_1$ to $C_6$ alkenyl or $C_6$ to $C_8$ aryl; wherein the silicone polymer has an average degree of polymerization of at least 5; and wherein $0.7>a/(a+b+c+d)\geq 0$; $1\geq b/(a+b+c+d)\geq 0$; $1\geq c/(a+b+c+d)\geq 0$; and $0.65\geq d/(a+b+c+d)\geq 0$.

6. A method for curing a curable composition comprising exposing the curable composition of claim 1 to radiation at a temperature from 0° C. to 200° C. in an atmosphere having a relative humidity of at least 10%.

7. The method of claim 6 wherein the radiation is selected from the group consisting of UV-containing light, electron beams, x-rays, and ion beams.

8. The method of claim 6 additionally comprising a post-treatment at a temperature from 0° C. to 200° C.

9. A method for curing a curable composition comprising exposing the curable composition of claim 1 to radiation at a temperature from 0° C. to 200° C.

10. The method of claim 9 wherein the radiation is selected from the group consisting of UV-containing light, electron beams, x-rays, and ion beams.

11. The method of claim 9 additionally comprising a post-treatment at a temperature from 0° C. to 200° C.

* * * * *

UNITED STATES PATENT AND TRADEMARK OFFICE
CERTIFICATE OF CORRECTION

PATENT NO. : 5,789,460
DATED : August 4, 1998
INVENTOR(S) : Brian Robert Harkness and Mamoru Tachikawa It is certified that error appears in the above-identified patent and that said Letters Patent is hereby corrected as shown below:

Column 4, Line 26 - N-(2-allylethenyl)amides should read N-(2-arylethenyl)amides.

Column 4, Line 63 - N-(2-allylethenyl)amides should read N-(2-arylethenyl)amides.

Column 22, Lines 22-23 - N-(2-allylethenyl)amides should read N-(2-arylethenyl)amides.

Column 4, Line 61 - $R^{17}CHC(=O)NR^{18}$ should read $R^{17}CH\underset{NR^{18}}{\overset{\diagdown\diagup}{C}}(=O)$ Column 5, Lines 9-10 - $BzCH_2OC(=O)NR^3R^4$ should read $BzOC(=O)NR^3R^4$.

Column 22, lines 34-35 - $BzCH_2OC(=O)NR^3R^4$ should read $BzOC(=O)NR^3R^4$

Signed and Sealed this

Twenty-fifth Day of April, 2000

Attest:

Attesting Officer

Q. TODD DICKINSON

Director of Patents and Trademarks